(12) United States Patent
Kamiya

(10) Patent No.: US 9,853,244 B2
(45) Date of Patent: Dec. 26, 2017

(54) ELECTROLUMINESCENCE DISPLAY DEVICE

(71) Applicant: Japan Display Inc., Tokyo (JP)

(72) Inventor: Akinori Kamiya, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/296,167

(22) Filed: Oct. 18, 2016

(65) Prior Publication Data

US 2017/0250371 A1 Aug. 31, 2017

(30) Foreign Application Priority Data

Feb. 25, 2016 (JP) ................................ 2016-033899

(51) Int. Cl.
| | | |
|---|---|---|
| *H01L 51/52* | (2006.01) | |
| *H01L 51/56* | (2006.01) | |
| *H01L 51/00* | (2006.01) | |
| *H01L 27/32* | (2006.01) | |

(52) U.S. Cl.
CPC ...... *H01L 51/5253* (2013.01); *H01L 27/3211* (2013.01); *H01L 27/3244* (2013.01); *H01L 51/003* (2013.01); *H01L 51/56* (2013.01); *H01L 2227/323* (2013.01); *H01L 2227/326* (2013.01); *H01L 2251/301* (2013.01); *H01L 2251/303* (2013.01); *H01L 2251/5338* (2013.01); *H01L 2251/558* (2013.01)

(58) Field of Classification Search
CPC ..... H01L 51/52; H01L 51/5253; H01L 51/56; H01L 51/003; H01L 27/3244
See application file for complete search history.

(56) References Cited

U.S. PATENT DOCUMENTS

| | | | |
|---|---|---|---|
| 7,928,646 B2 | 4/2011 | Ryuji et al. | |
| 8,500,504 B2 | 8/2013 | Ryuji et al. | |
| 9,166,194 B2 | 10/2015 | Kato et al. | |
| 9,276,239 B2 | 3/2016 | Park et al. | |

(Continued)

FOREIGN PATENT DOCUMENTS

| | | |
|---|---|---|
| JP | 2009-266922 A | 11/2009 |
| JP | 2014-154450 A | 8/2014 |

(Continued)

OTHER PUBLICATIONS

Taiwanese Office Action dated Jun. 21, 2017 for corresponding Taiwanese Patent Application No. 105132851, with partial English translation.

*Primary Examiner* — Phuc Dang
(74) *Attorney, Agent, or Firm* — Typha IP LLC

(57) ABSTRACT

Provided is a method for manufacturing a display device. The method includes: forming a first electrode; forming an insulating film covering an edge portion of the first electrode; forming an EL layer over the first electrode and the insulating film; forming a second electrode over the EL layer; forming, over the second electrode, a first layer including an inorganic compound; forming, over the first layer, a second layer including an organic compound so as to overlap with the insulating film and the EL layer; thinning the second layer so that the first layer is exposed in a region overlapping with the insulating film; and forming, over the second layer, a third layer including an inorganic compound.

14 Claims, 12 Drawing Sheets

(56) References Cited

U.S. PATENT DOCUMENTS

2010/0283056 A1* 11/2010 Yasumatsu ........ G02F 1/133305
  257/59
2014/0225089 A1   8/2014 Kato et al.
2015/0041813 A1*  2/2015 Kim ..................... H01L 27/124
  257/59
2015/0236298 A1*  8/2015 Kim ........................ H01L 51/56
  438/26
2015/0340654 A1  11/2015 Kato et al.
2016/0172423 A1*  6/2016 Nendai ............... H01L 27/3246
  257/40

FOREIGN PATENT DOCUMENTS

TW   200833164 A   8/2008
TW   201438313 A  10/2014

\* cited by examiner

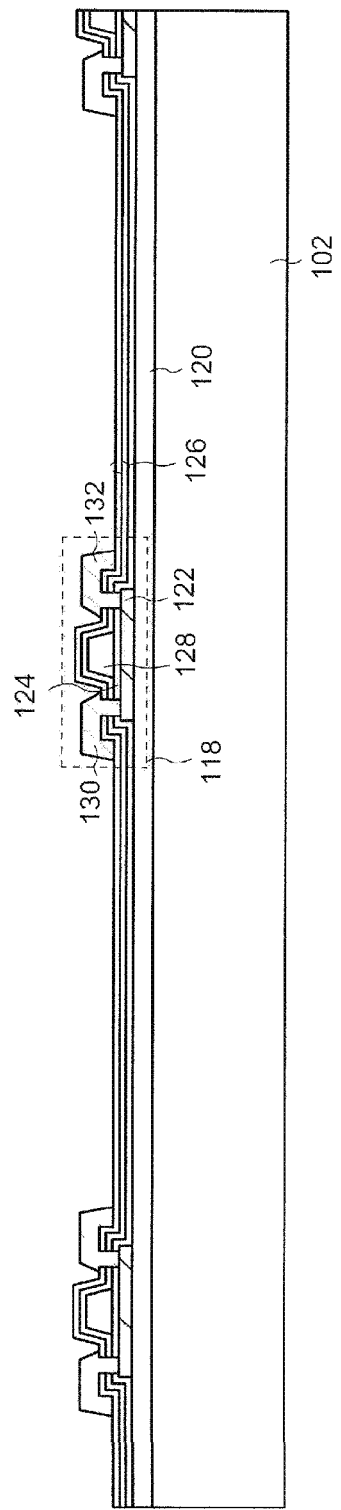
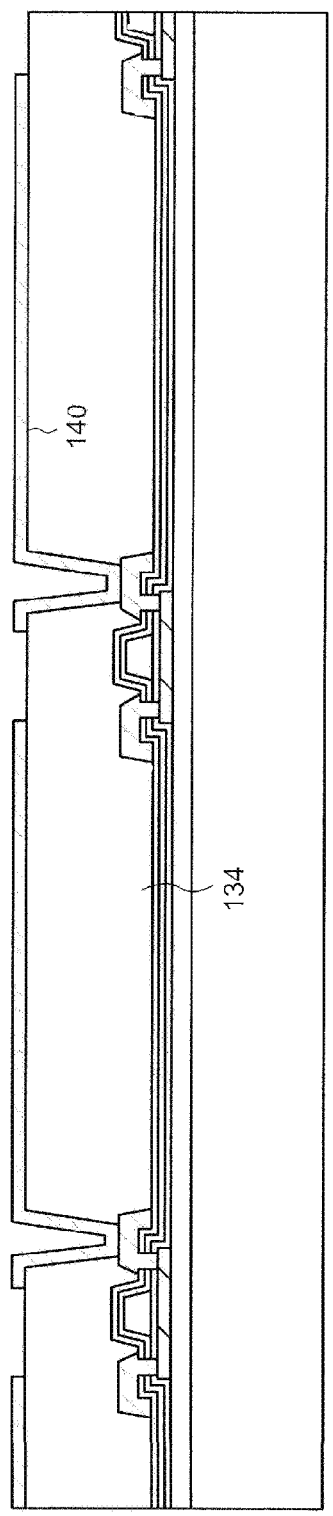
FIG. 3A
FIG. 3B

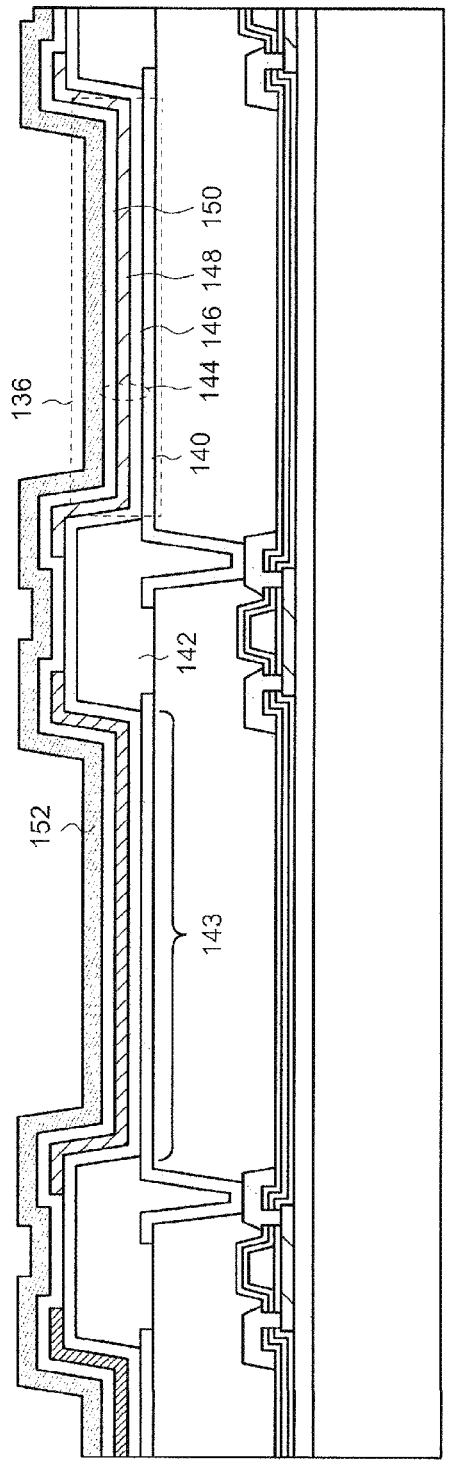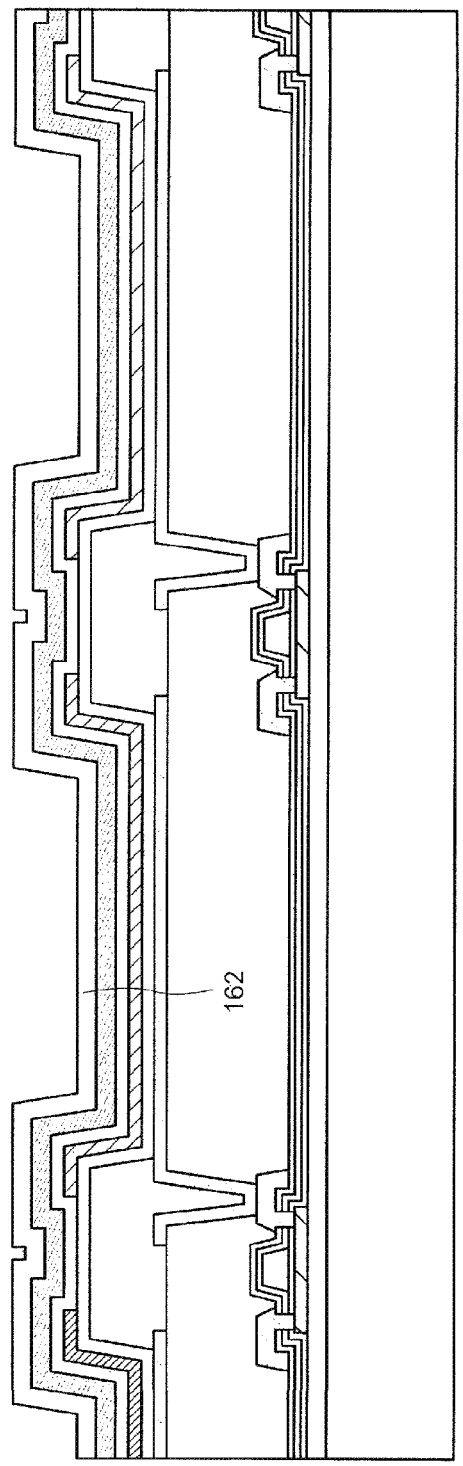

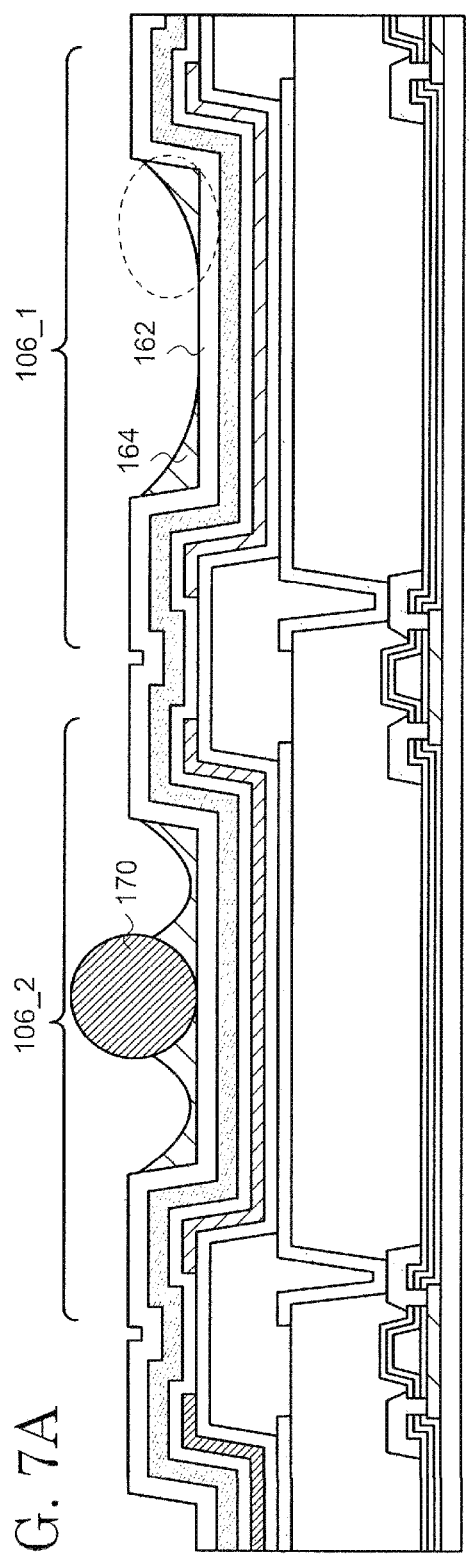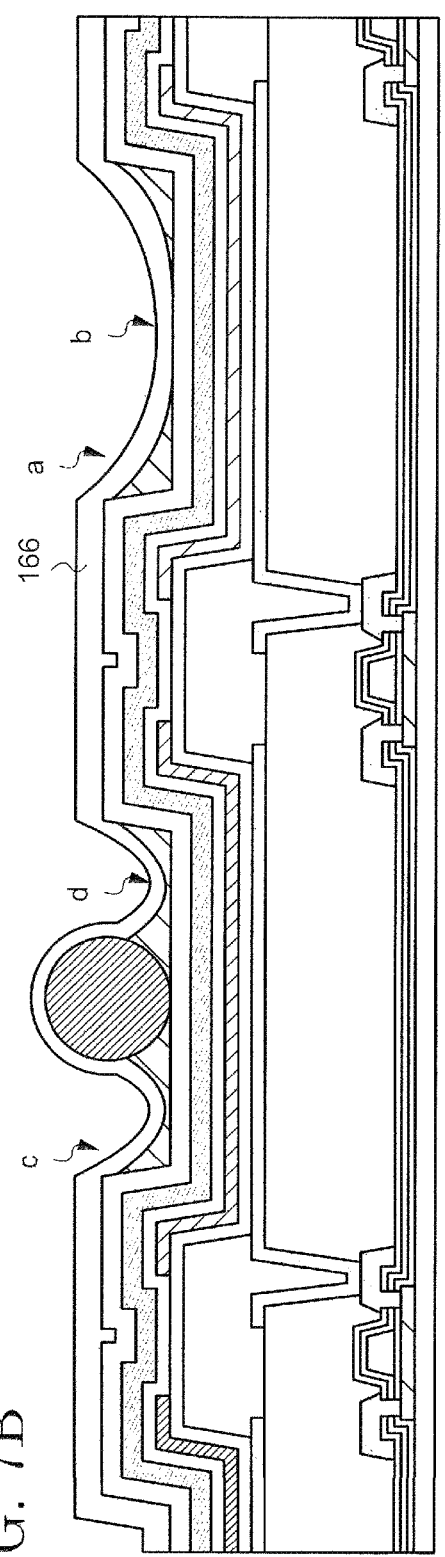
FIG. 7A
FIG. 7B

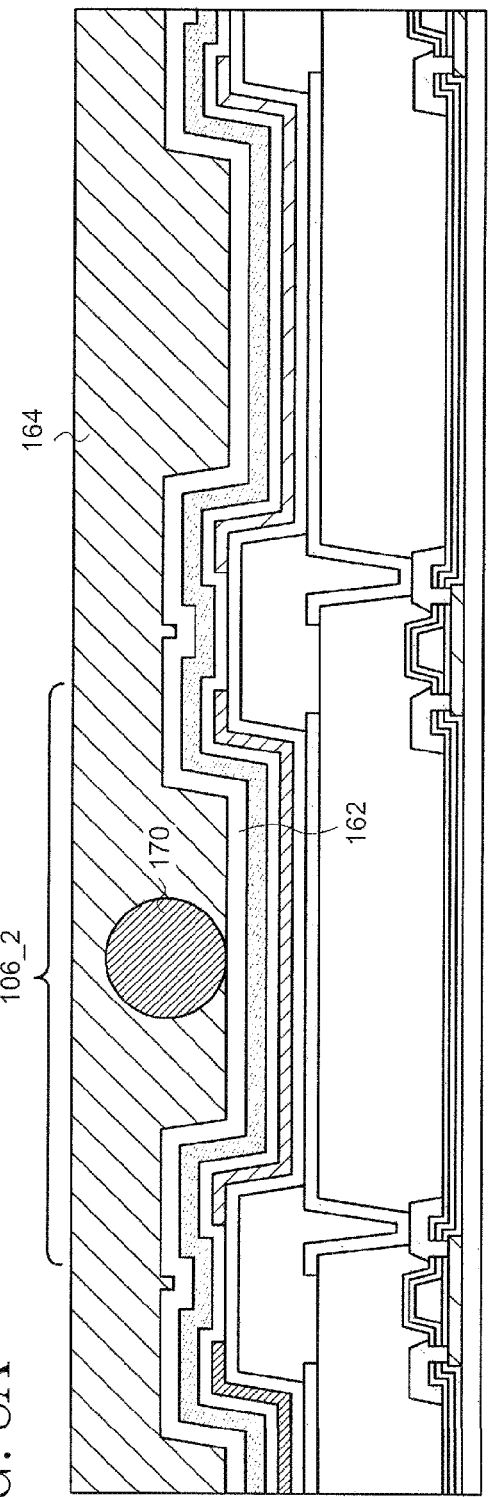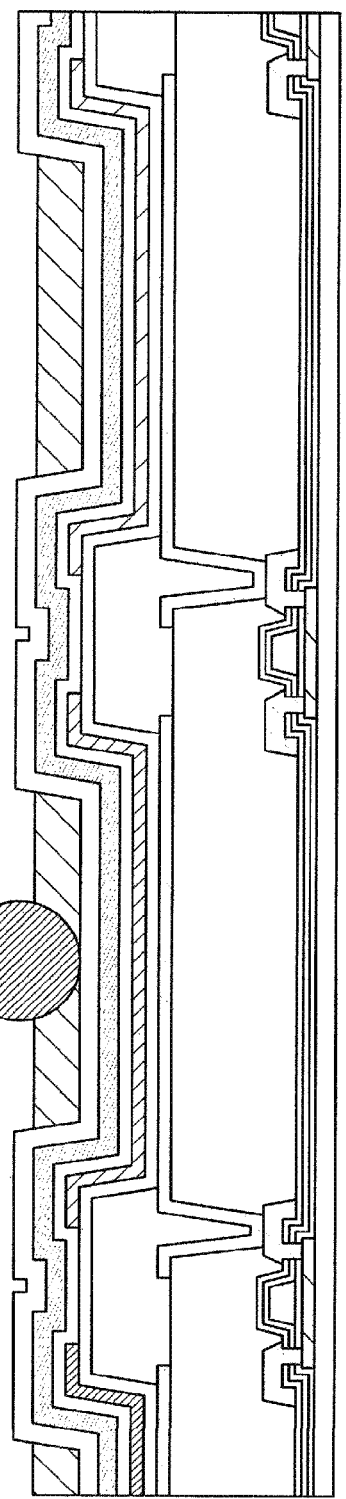
FIG. 8A
FIG. 8B

200

ELECTROLUMINESCENCE DISPLAY DEVICE

CROSS REFERENCE TO RELATED APPLICATIONS

This application is based on and claims the benefit of priority from the prior Japanese Patent Application No. 2016-033899, filed on Feb. 25, 2016, the entire contents of which are incorporate herein by reference.

FIELD

The present invention relates to a display device such as an EL display device and its manufacturing method.

BACKGROUND

A liquid crystal display device and an EL (electroluminescence) display device which respectively have a liquid crystal element and a light-emitting element in each pixel are represented as a typical example of a display device. These display devices have display elements such as a liquid crystal element or an organic light-emitting element (hereinafter, referred to as a light-emitting element) in each of the plurality of pixels formed over a substrate. A liquid crystal element and a light-emitting element have a liquid crystal and a layer including an organic compound (hereinafter, referred to as an organic layer), respectively, between a pair of electrodes and are operated by applying a voltage or supplying current between the pair of electrodes.

Apart from a liquid crystal element, current flows in an organic compound included in a layer (hereinafter, referred to as an EL layer) sandwiched between a pair of electrodes in a light-emitting element. Therefore, the organic compound is oxidized or reduced during operation of the light-emitting element and may exist in a state having an electric charge. Additionally, an excited state is formed by recombination of these active species. Such active species readily react with other organic compounds or impurities such as water and oxygen which enter the light-emitting element because they have a higher reactivity than an electrically neutral state or a ground state. The products formed as a result of the reaction influence the characteristics of the light-emitting element and cause a decrease in efficiency and lifetime of the light-emitting element.

As a method for suppressing the aforementioned deterioration of the characteristics, it has been known to form a protection film (passivation film) over a light-emitting element. As disclosed in Japanese patent application publications No. 2014-154450 and 2009-266922, it is possible to prevent or suppress the reduction of the efficiency and lifetime of the light-emitting element because the entrance of the impurities into the light-emitting element can be prevented or suppressed by the protection film.

SUMMARY

A purpose of the present invention is to supply a display device having high display quality, such as an organic EL display device and a flexible organic EL display device. Alternatively, a purpose of the present invention is to supply a manufacturing method of the display device.

An embodiment of the present invention is a method for manufacturing a display device. The method includes: forming a first electrode; forming an insulating film covering an edge portion of the first electrode; forming an EL layer over the first electrode and the insulating film; forming a second electrode over the EL layer; forming, over the second electrode, a first layer including an inorganic compound; forming, over the first layer, a second layer including an organic compound so as to overlap with the insulating film and the EL layer; thinning the second layer so that the first layer is exposed in a region overlapping with the insulating film; and forming, over the second layer, a third layer including an inorganic compound.

An embodiment of the present invention is a method for manufacturing a display device. The method includes: forming a base substrate over a substrate; forming a first electrode over the base substrate; forming an insulating film covering an edge portion of the first electrode; forming an EL layer over the first electrode and the insulating film; forming a second electrode over the EL layer; forming, over the second electrode, a first layer including an inorganic compound; forming, over the first layer, a second layer including an organic compound so as to overlap with the insulating film and the EL layer; thinning the second layer so that the first layer is exposed in a region overlapping with the insulating film; forming, over the second layer, a third layer including an inorganic compound; and separating the substrate from the base substrate.

An embodiment of the present invention is a display device. The display device includes a first sub-pixel and a second sub-pixel which are adjacent to each other, and the first sub-pixel and the second sub-pixel each have a light-emitting element. The light-emitting elements of the first sub-pixel and the second sub-pixel have a first electrode, a second electrode, and an EL layer sandwiched between the first electrode and the second electrode. The display device further includes an insulating film located between the first sub-pixel and the second sub-pixel and overlapping with the first electrodes of the first sub-pixel and the second sub-pixel. The display device also includes: a first layer overlapping with the light-emitting elements of the first sub-pixel and the second sub-pixel and including an inorganic compound as a main component; a second layer over the first layer, the second layer including an organic compound as a main component; and a third layer over the second layer, the third layer including an inorganic compound as a main component. The second layer is divided between the first sub-pixel and the second sub-pixel.

An embodiment of the present invention is a display device. The display device includes a light-emitting element which has a first electrode, an EL layer over the first electrode, and a second electrode over the EL layer. The display device further includes an insulating film which has an opening portion overlapping with the first electrode, which covers an edge portion of the first electrode, and which is located underneath the EL layer. The display device also includes: a first layer over the light-emitting element, the first layer including an inorganic compound as a main component; a second layer over the first layer, the second layer including an organic compound as a main component; and a third layer over the second layer, the third layer including an inorganic compound as a main component. The first layer and the third layer are in contact with each other in a region overlapping with the insulating film. A top surface of the second layer is flat in a region overlapping with the opening portion.

BRIEF DESCRIPTION OF DRAWINGS

FIG. 3A and FIG. 3B are each a schematic cross-sectional view showing a manufacturing method of a display device according to an embodiment;

FIG. 4A and FIG. 4B are each a schematic cross-sectional view showing a manufacturing method of a display device according to an embodiment;

FIG. 7A and FIG. 7B are each a schematic cross-sectional view showing a manufacturing method of a display device;

FIG. 8A and FIG. 8B are each a schematic cross-sectional view showing a manufacturing method of a display device according to an embodiment;

DESCRIPTION OF EMBODIMENTS

Figure 1:
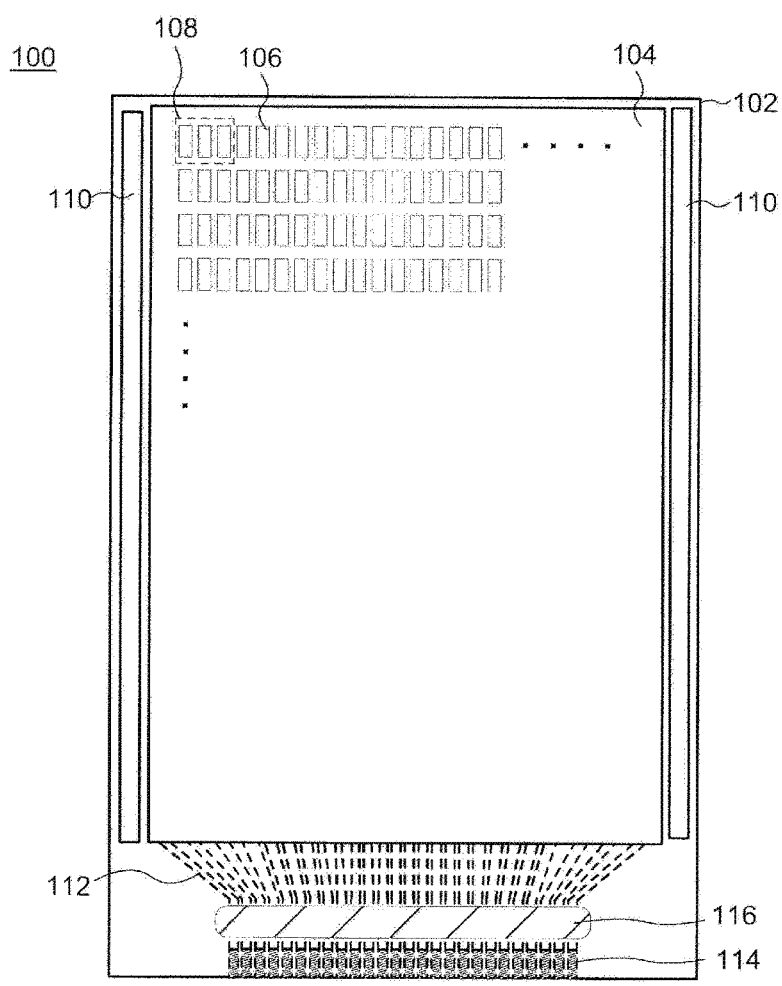
FIG. 1 is a schematic top view of a display device according to an embodiment.

Hereinafter, each embodiment of the present invention is explained with reference to the drawings. The invention can be implemented in a variety of modes within the scope of the concept and should not be interpreted as being limited to the disclosure of the following embodiments.

In the drawings, the width, thickness, shape, and the like of each component may be schematically illustrated and different from those of an actual mode in order to provide a clearer explanation. However, the drawings simply give an example and do not limit the interpretation of the present invention. In the specification and each of the drawings, the same reference number is provided to an element which is the same as that appearing in preceding drawings, and a detailed explanation may be omitted as appropriate.

In the present invention, when a plurality of films is formed by processing one film, the plurality of films may have functions or roles different from each other. However, the plurality of films originates from a film which is formed as the same layer in the same process. Therefore, the plurality of films is defined as films existing in the same layer.

Embodiment 1

In the present embodiment, a display device according to an embodiment of the present invention is explained by using FIG. 1 to FIG. 9.
1. Structure of Display Device A top view of the display device 100 according to the present embodiment is shown in FIG. 1. The display device 100 has a display region 104 including a plurality of pixels 108 and a gate side driver circuit (hereinafter, referred to as a driver circuit) 110 over one surface (top surface) of a base substrate 102. Light-emitting elements having emission colors different from each other can be provided in a plurality of sub-pixels 106 included in one pixel 108, by which full-color display can be performed. For example, red-emissive, green-emissive, and blue emissive light-emitting elements can be formed in three sub-pixels 106, respectively. Alternatively, a white-emissive light-emitting element may be employed in all sub-pixels 106, and red, green, and blue colors may be extracted from the respective sub-pixels by using a color filter, by which full-color display can be conducted. The combination of the colors finally extracted is not limited to that including red, green, and blue colors. For example, one pixel 108 may be configured to include four sub-pixels 106, and red, green, blue, and white colors may be extracted from the four sub-pixels 106.

The sub-pixels 106 are illustrated so as to have a rectangular shape in FIG. 1. However, the embodiment of the present invention is not limited thereto, and the shape of the sub-pixels 106 may be square or polygonal. Furthermore, although the pixels 108 also have a rectangular region, each pixel 108 may have a square shape. There is no limitation to an arrangement of the sub-pixels 106, and a stripe arrangement, a delta arrangement, a Pentile arrangement, and the like can be employed.

Wiring 112 extends from the display region 104 to a side surface (a short side of the display device 100 in FIG. 1) of the base substrate 102 and is exposed at an edge portion of the base substrate 102 to form terminals 114. The terminals 114 are connected to a connector (not illustrated) such as a flexible printed circuit (FPC). The display region 104 is also electrically connected to an IC chip 116 via the wiring 112. With this structure, an image signal supplied from an external circuit (not illustrated) is provided to the sub-pixels 106 via the driver circuit 110 and the IC chip 116, and the emission of the sub-pixels 106 is controlled to reproduce an image on the display region 104.

Figure 2:
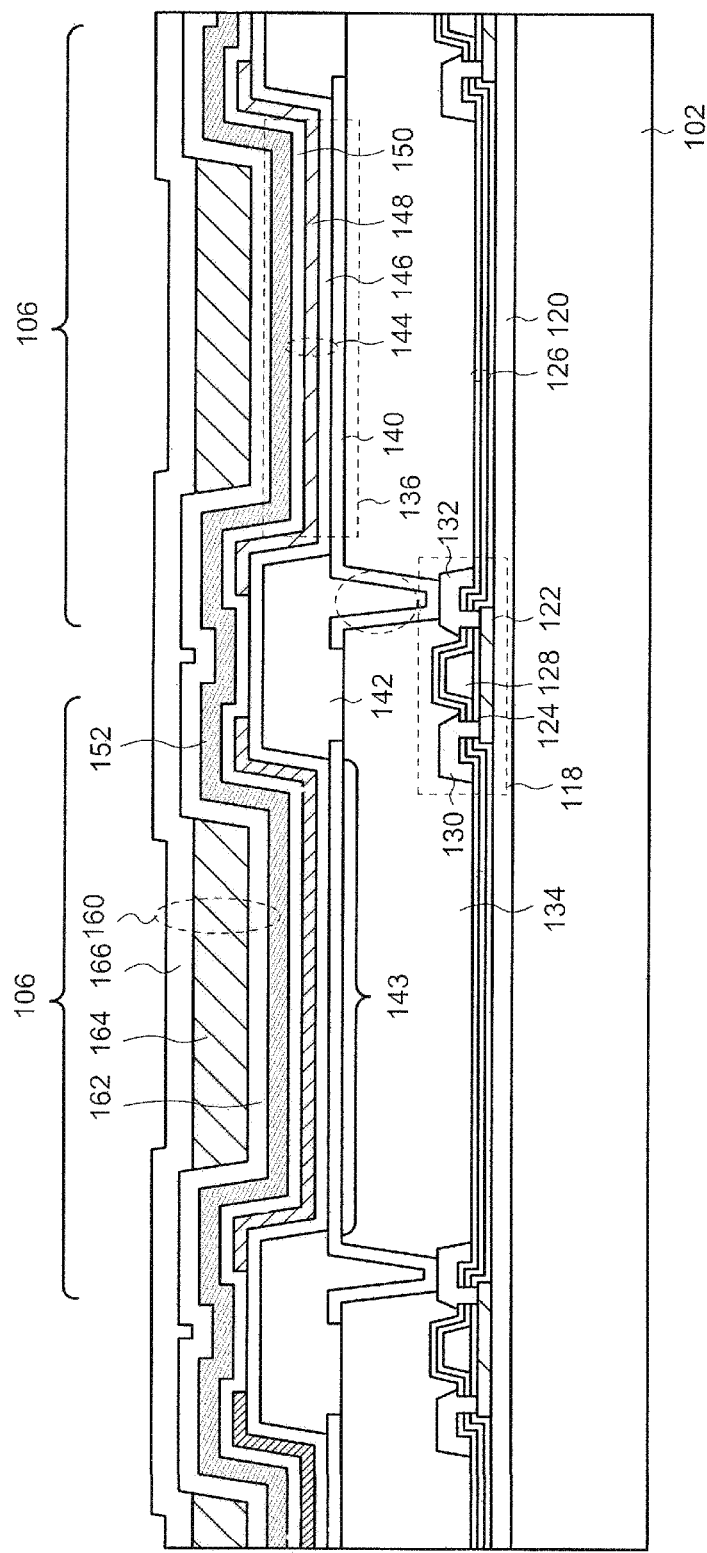
FIG. 2 is a schematic cross-sectional view of a display device according to an embodiment.

A schematic cross-sectional view of the display device 100 is shown in FIG. 2. FIG. 2 is a schematic cross-sectional view illustrating two sub-pixels 106 arranged in the display region 104. In each of the sub-pixels 106, a transistor 118 is disposed over the base substrate 102, and a light-emitting element 136 is electrically connected to the transistor 118. More specifically, an undercoat 120 is formed over the base substrate 102 over which the transistor 118 is disposed. The transistor 118 has a semiconductor film 122, a gate insulating film 124, a gate 128, an interlayer insulating film 126, a source 130, and a drain 132. Each of the sub-pixels 106 is illustrated in FIG. 2 so as to have one transistor 118. However, each sub-pixel 106 may include a plurality of transistors and have another element other than a transistor, such as a capacitor element. The transistor 118 illustrated in FIG. 2 has a top-gate structure. However, there is no limitation to the structure of the transistor 118, and the transistor 118 may have a bottom-gate structure. Furthermore, polarity of the transistor 118 is not limited, and the transistor 118 may have any of the N-channel type and P-channel type polarities.

A leveling film 134 which is an insulating film is formed over the transistor 118, and a first electrode 140 of the light-emitting element 136 is electrically connected to the transistor 118 in an opening portion (a region surrounded by a dotted ellipse in FIG. 2) provided in the leveling film 134.

An edge portion of the first electrode 140 and the opening portion of the leveling film 134 are covered by an insulating film (hereinafter, referred to as a partition wall) 142. Although not illustrated, the partition wall 142 covers the edge portion of the periphery of the first electrode 140. Therefore, the partition wall 142 is an insulating film having an opening portion 143, and the opening portion 143 overlaps with the first electrode 140.

An EL layer 144 is formed over the first electrode 140 and the partition wall 142 over which a second electrode 152 is disposed. In the specification and claims, the EL layer means a layer formed between a pair of electrodes, structured by one or plurality of layers including an organic compound, and undergoing recombination of holes and electrons injected from the pair of electrodes. Although an example in which the EL layer 144 is composed of a first organic layer 146, a second organic layer 148, and a third organic layer 150 is shown in FIG. 2, the EL layer 144 can be structured by using four or more organic layers.

The first organic layer 146 and the third organic layer 150 are formed so as to extend over the adjacent sub-pixels 106 and continue over the partition wall 142. In contrast, the second organic layer 148 is separated between the adjacent sub-pixels 106. The first organic layer 146 and the third organic layer 150 have a function for transporting carriers (hole and electron) injected from the first electrode 140 and the second electrode 152 to the second organic layer 148, for example. On the other hand, the recombination of the holes and electrons occurs in the second organic layer 148 by which light-emission from the excited state formed by the recombination can be obtained. Emission colors different between the adjacent sub-pixels 106 are attainable by configuring the second organic layer 148 so that the structure or material of the second organic layer 148 is different between adjacent sub-pixels. Note that the second organic layer 148 may also be formed so as to be shared by the adjacent sub-pixels 106, which allows them to have the same element structure. In this case, the EL layer 144 can be formed so that white emission is obtained from the second organic layer 148, for example. Light emission with different colors can be extracted from these sub-pixels 106 by providing color filters with different absorption properties to the adjacent sub-pixels 106.

A passivation film 160 is arranged over the second electrode 152. The passivation film 160 includes a first layer 162, a second layer 164, and a third layer 166.

The first layer 162 preferably includes an inorganic compound, and the inorganic compound preferably includes silicon. For example, the inorganic compound is selected from silicon oxide, silicon nitride, silicon oxynitride, silicon nitride oxide, and the like. As shown in FIG. 2, the first layer 162 is in contact with the second electrode 152 and can be formed so as to continue and extend over the adjacent sub-pixels 106. The first layer 162 has an inclination (or projection and depression) in a plane due to the partition wall 142, the projected portions overlap with the partition wall 142, and the depressed portion is located between two projected portions.

The second layer 164 is formed over the first layer 162 and preferably includes an organic compound. A polymer material typified by a resin can be represented as an organic compound. The polymer material may have a linear chain structure or exist in a state in which a three-dimensional network is formed by crosslinking. As a polymer material, an epoxy resin, an acrylic resin, a polyimide, a polyamide, a polycarbonate, a polysiloxane, and the like are represented. The second layer 164 preferably includes a material having a high transmittance with respect to visible light.

As shown in FIG. 2, the second layer 164 is discontinuous over the partition wall 142 and separated between the adjacent sub-pixels 106. It is preferred that a top surface of the second layer 164 be flat in a region overlapping with the opening portion 143 of the partition wall 142. Furthermore, it is preferred that in the depression of the first layer 162, a part of a top surface of the first layer 162, which is parallel to a top surface of the first electrode 140, be all in contact with a bottom surface of the second layer 164. With this structure, the first layer 162 and the third layer 166 can be in contact with each other in a region overlapping with the partition wall 142.

As described above, a material preferred for the formation of the second layer 164 is an organic compound. Compared with an inorganic compound, an organic compound readily absorbs water, and the second layer 164 might work as a layer for transporting water when water enters from outside. However, separation of the second layer 164 between the adjacent sub-pixels 106 disconnects the transportation route of water, which makes it difficult to transport water to the adjacent sub-pixels even if water enters one sub-pixel 106. As a result, the influence of entrance of water from outside can be suppressed and minimized.

Moreover, formation of the second layer 164 with a flat top surface allows the formation of the third layer 166 having a high flatness. Hence, the third layer 166 is not divided between the sub-pixels 106 and can cover the display region 104, which enables it to effectively prevent the entrance of water to the sub-pixels 106 from outside.

A thickness of the second layer 164 may be smaller than a thickness of the partition wall 142. Although not shown, the partition wall 142 may be formed so as to protrude from the second layer 164.

The third layer 166 is formed over the second layer 164. The third layer 166 can be formed by using a material usable in the first layer 162 with a method applicable to the formation of the first layer 162. The first layer 162 and the third layer 166 may include the same material. It is preferred that at least one of the first layer 162 and the third layer 166 include silicon oxide. As shown in FIG. 2, the third layer 166 may be formed so as to extend and continue over the adjacent sub-pixels 106.

2. Manufacturing Method of Display Device

A manufacturing method of the display device 100 having the aforementioned structure is shown in FIG. 3A to FIG. 6B. As shown in FIG. 3A, the transistor 118 is first formed over the base substrate 102 with the undercoat 120 interposed therebetween.

The base substrate 102 has a function to support the display region 102, the driver circuit 110, and the like. Thus, any material can be used as long as it has physical strength to support the display region 104, the driver circuit 110, and the like, heat tolerance to the temperature in the process for fabricating the elements (e.g., transistor 118 and light-emitting element 136) over the base substrate 102, and chemical stability to the chemicals used in the process. Specifically, the base substrate 102 may include glass, quartz, plastic, a metal, ceramics, and the like. When flexibility is provided to the display device 100, a plastic-including material can be used, and a polymer material such as a polyimide, a polyamide, a polyester, and a polycarbonate can be employed, for example.

The undercoat 120 is a film having a function to prevent the diffusion of impurities from the base substrate 102 to the semiconductor film 122 and the like, and can be formed by using an inorganic compound such as silicon nitride, silicon oxide, silicon nitride oxide, and silicon oxynitride with a chemical vapor deposition (CVD) method, a sputtering method, and the like.

The semiconductor film 122 is formed over the undercoat 120. The semiconductor film 122 may be formed by using a material exhibiting a semiconductor property, such as silicon, germanium, and an oxide semiconductor with a CVD method, a sputtering method, and the like. There is no specific limitation to the crystallinity of the semiconductor film 122, and the semiconductor film 122 can possess a morphology such as a single crystal state, a polycrystal state, a microcrystal state, and an amorphous state.

Next, the gate insulating film 124 is formed over the semiconductor film 122, and the gate 128 is formed thereover. The gate insulating film 124 can also be formed by using the same material and the method which are applicable for the undercoat 120, and preferably includes silicon oxide. The undercoat 120 and the gate insulating film 124 each may have a single-layer structure or a stacked structure including a plurality of layers. In FIG. 3A, the undercoat 120 and the gate insulating film are each illustrated so as to have a single-layer structure. The gate 128 can be formed with a metal such as titanium, aluminum, copper, molybdenum, tungsten, and tantalum or its alloy in a single-layer structure or a stacked layer structure. For example, a stacked structure can be employed in which a metal having a high conductivity, such as aluminum and copper, is sandwiched by a metal with a high melting point, such as titanium and molybdenum. As the formation method of the gate 128, a sputtering method, a CVD method, a printing method, or the like can be represented.

After the formation of the gate 128, the interlayer insulating film 126 is formed. The interlayer insulating film 126 can be formed by using the same material and the method which are applicable for the undercoat 120 and preferably includes silicon nitride. The interlayer insulating film 126 may have a single-layer structure or be structured by a plurality of layers as shown in FIG. 2. For example, the interlayer insulating film 126 can be formed by stacking a layer including silicon nitride and a layer including silicon oxide.

Next, the source 130 and the drain 132 are formed. They can be formed by using the material usable in the gate 128 with a CVD method or a sputtering method.

Next, the leveling film 134 is formed so as to cover the source 130 and the drain 132 (FIG. 3B). The leveling film 134 preferably includes a polymer material such as an epoxy resin, an acrylic resin, a polyester, a polyamide, a polyimide, and a polysiloxane. The leveling film 134 can be formed with a wet film-forming method such as a spin-coating method, an ink-jet method, and a dip-coating method or a lamination method. The projections and the depressions caused by the transistor 118 are absorbed by the formation of the leveling film 134, leading to the formation of a flat surface.

The opening portion which reaches the drain 132 is formed in the leveling film 134, and the first electrode 140 is formed so as to be in contact with the drain 132 (FIG. 3B) by which the first electrode 140 is electrically connected to the transistor 118. The first electrode 140 and the drain 132 are in direct contact with each other in FIG. 3B. However, a layer having conductivity may be formed between the first electrode 140 and the drain 132.

When the light emission from the light-emitting element 136 is extracted through the base substrate 102, the first electrode 140 may be formed with an oxide having a light-transmitting property, for example, so as to transmit visible light. As an oxide having a light-transmitting property, indium-tin oxide (ITO), indium-zinc oxide (IZO), and the like are represented. As the formation method thereof, a sputtering method is given. When the light-emission from the light-emitting element 136 is extracted in a direction opposite to the base substrate 102, a metal with a high reflectance can be used for the first electrode 140 so as to reflect visible light. Specifically, silver, aluminum, and the like are represented. Alternatively, an oxide having a light-transmitting property may be stacked over a metal with a high reflectance.

Next, the partition wall 142 is formed (FIG. 4A). The partition wall 142 can be formed by forming a material usable in the leveling film 134 over the whole of the base substrate 102 with the application of the aforementioned wet film-forming method and then forming the opening portion 143 which exposes a part of the first electrode 140. By this process, the partition wall 142 is able to cover the edge portion of the first electrode 140. The partition wall 142 is preferably formed so as to include the same material as the leveling film. A width (corresponding to an interval between the adjacent sub-pixels 106) of the partition wall (which corresponds to an interval between the adjacent sub-pixels 106) is equal to or larger than 15 µm and equal to or smaller than 50 µm or equal to or larger than 20 µm and equal to or smaller than 40 µm. A typical width is approximately 30 µm. A thickness of the partition wall 142 is equal to or larger than 0.2 µm and equal to or smaller than 3 µm or equal to or larger than 0.5 µm and equal to or smaller than 2 µm. A typical thickness is approximately 1 µm.

Next, the EL layer 144 and the second electrode 152 are formed (FIG. 4B). As described above, the EL layer 144 may have the same structure between the adjacent sub-pixels 106. Alternatively, a part of the layers may be different between the adjacent sub-pixels 106 as shown in FIG. 4A. In the example shown in FIG. 2, the EL layer 144 possesses three layers (the first organic layer 146, the second organic layer 148, and the third organic layer 150), and the second organic layer 148 is different between the adjacent sub-pixels 106. Each of the layers included in the EL layer 144 can be fabricated by applying an evaporation method which is a dry film-forming method or the aforementioned wet film-forming method. The formation of the second electrode 152 can be conducted with the material and method applicable to the formation of the first electrode 140. When the light-emission from the light-emitting element 132 is obtained from a side of the base substrate 102, a metal with a high reflectance or its alloy may be used for the second electrode 152. When the light-emission from the light-emitting element 136 is extracted in a direction opposite to the base substrate 102, an oxide having a light-transmitting property, such as ITO and IZO, may be used.

Next, the passivation film 160 for protecting the light-emitting element 136 is formed (FIG. 4B). Specifically, the first layer 162 is first formed over the second electrode 152. Thus, the first layer 162 and the second electrode 152 can be in contact with each other. The first layer 162 can include an inorganic compound such as silicon nitride, silicon oxide, silicon nitride oxide, and silicon oxynitride and can be formed by applying a CVD method or a sputtering method. As shown in FIG. 4B, the first layer 162 may be formed over the whole base substrate 102. Therefore, the first layer 162 is able to have a continuous structure between the adjacent sub-pixels 106 and overlap with the partition wall 142.

Figure 5:
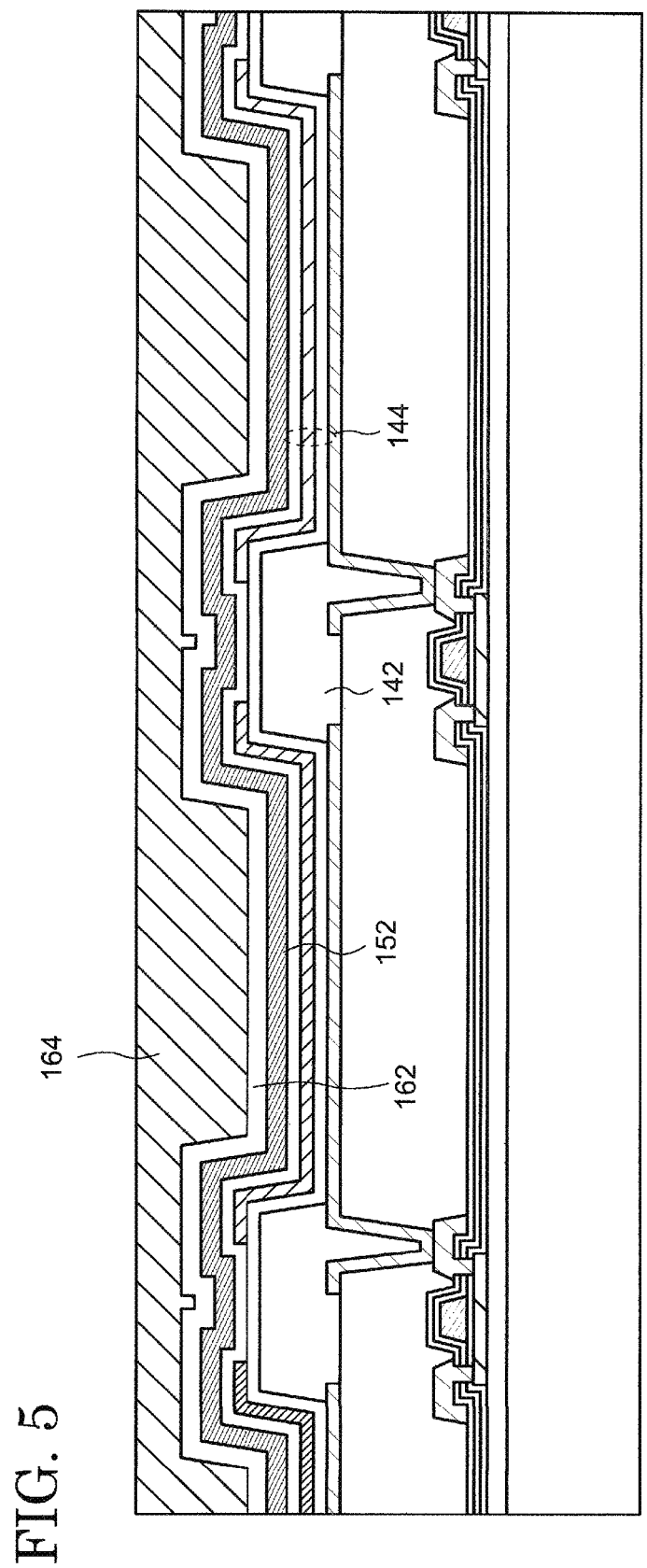
FIG. 5 is a schematic cross-sectional view showing a manufacturing method of a display device according to an embodiment.

Next, the second layer 164 is formed over the first layer 162 (FIG. 5). The second layer can include a polymer material such as an epoxy resin, an acrylic resin, a polyimide, a polyester, or a polycarbonate. The second layer 164 can be formed by the aforementioned wet film-forming method. Alternatively, the second layer 164 may be formed by atomizing or gasifying oligomers which are a raw material of the aforementioned polymer material under a reduced pressure, spraying the base substrate 102 with the atomized or gasified oligomers, and then polymerizing the oligomers. At this time, a polymerization initiator may be mixed in the oligomers. Additionally, the base substrate 102 may be sprayed with the oligomers while cooling the base substrate 102.

As shown in FIG. 5, it is preferred to form the second layer 164 so as to absorb the inclination (projections and depressions) in the EL layer 144, the second electrode 152, and the first layer 162 caused by the partition wall 142. That is, it is preferred to form the second layer 164 so that the inclination in the plane of the first layer 162 is absorbed and the second layer 164 possesses a flat top surface. The second layer 164 is preferred to have a thickness equal to or larger than 1 μm, and the thickness is equal to or larger than 1 μm and equal to or smaller than 5 μm or equal to or larger than 1.1 μm and equal to or smaller than 3 μm, for example. With this structure, the second layer 164 is able to cover the first layer 162 in a region overlapping with the partition wall 142 and possess a continuously flat top surface from a region overlapping with the first electrode 140 to a region overlapping with the partition wall 142.

Note that the second layer 164 may be formed so as not to completely cover the first layer 162 in a region overlapping with the partition wall 142, allowing the first layer 162 to be exposed over the partition wall 142. In this case, it is preferred that the second layer 164 be formed so as to have an even thickness in the depressions in the first layer 162 or have a thickness which allows the whole top surface of the second layer 164 to be substantially flat.

Next, the second layer 164 is thinned in order to reduce its thickness. Specifically, a plasma treatment is performed on the second layer 164 to reduce its thickness. The plasma treatment may be conducted in the presence of an oxygen-containing gas such as an oxygen gas, a nitrogen monoxide gas, or a nitrogen dioxide gas. The thinning of the second layer 164 allows the first layer 162 to be exposed in a region overlapping with the partition wall 142 and the second layer 164 to be divided between the adjacent sub-pixels 106. The second layer 164 gives a flat top surface in a region overlapping with the opening portion 143 of the partition wall 142. In the depression of the first layer 162, a part of the top surface of the first layer 162, which is parallel to the top surface of the first electrode 140, is all in contact with the bottom surface of the third layer 166.

Note that the plasma treatment can be omitted when the second layer 164 is formed so that the second layer does not completely cover the first layer 162 in a region overlapping with the partition wall 142 and the first layer 162 is exposed over the partition wall 142.

Figure 6A:
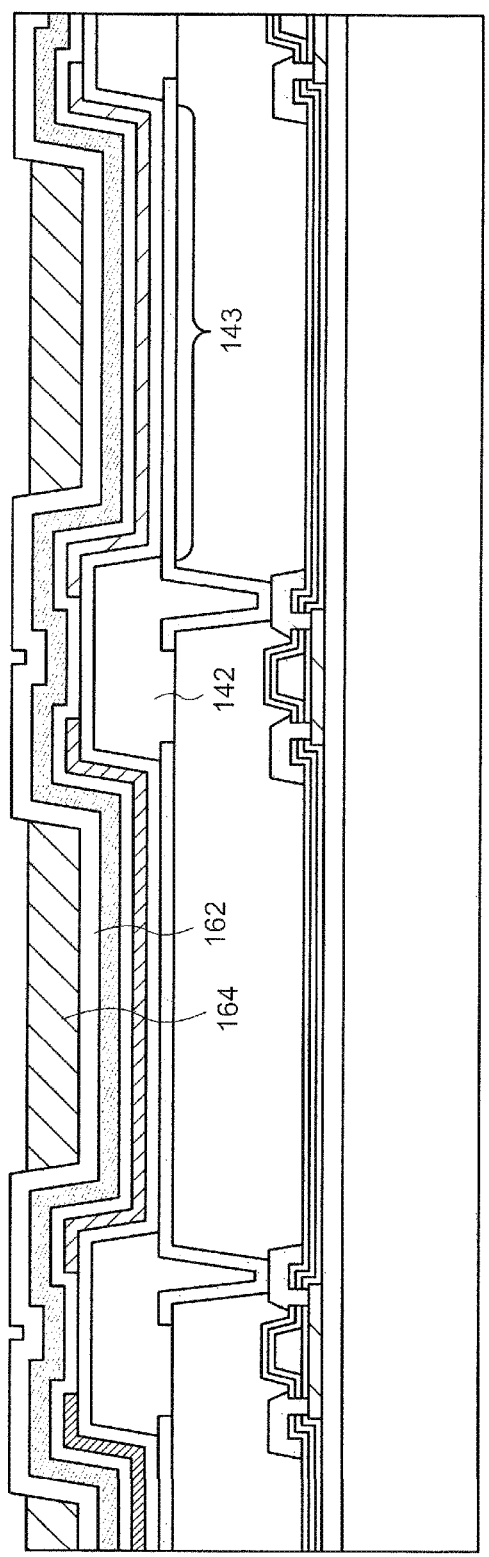
FIG. 6A and FIG. 6B are each a schematic cross-sectional view showing a manufacturing method of a display device according to an embodiment.
Figure 6B:
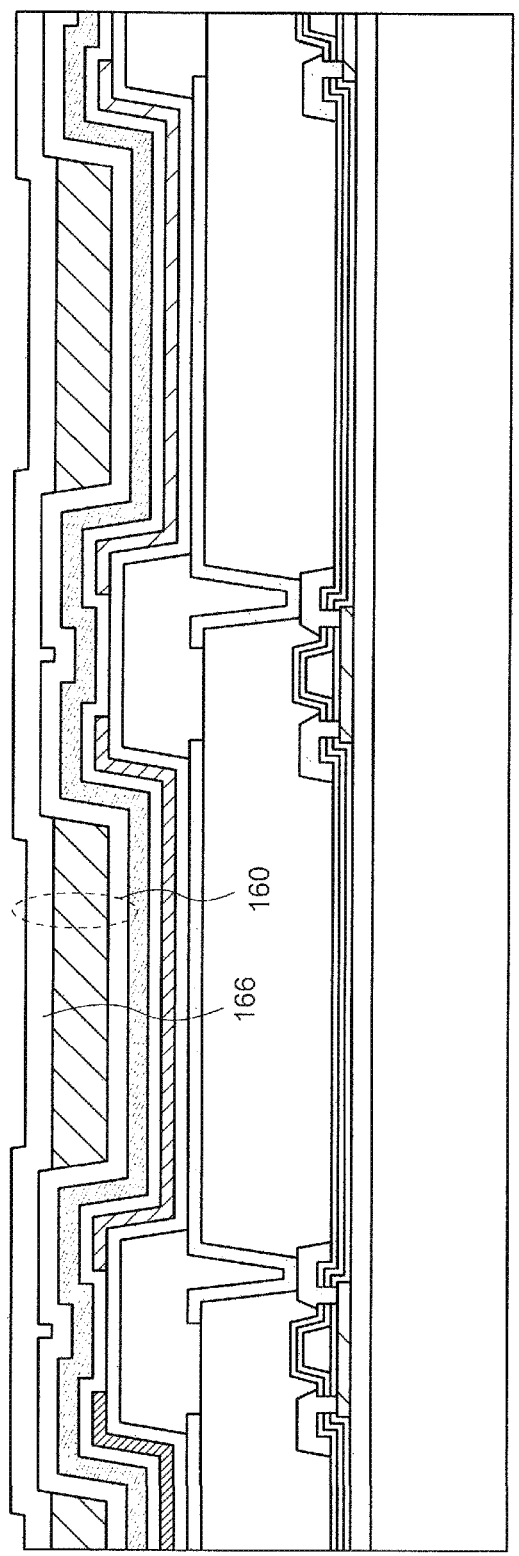

Next, the third layer 166 is formed over the second layer 164 (FIG. 6B). The third layer 166 can include a material usable in the first layer 162 and can be formed with the same method applicable for the formation of the first layer 162. The formation of the third layer 166 allows the first layer 162 and the third layer 166 to be in contact with each other in a region overlapping with the partition wall 142. Additionally, the interface at which the second layer 162 contacts with the third layer 166 is flat, and the second layers 164 are separated from each other between the adjacent sub-pixels 106. That is, the second layer 164 is not in contact with the third layer 166 in a region overlapping with the partition wall 142.

Note that the third layer 166 may be formed without reducing the thickness of the second layer 164 when the second layer 164 has a high light-transmitting property with respect to visible light.

Through the aforementioned processes, the display device 100 according to the present embodiment can be manufactured. Although not shown, as an optional structure, a color filter, a light-shielding film, a substrate (opposing substrate) opposing the base substrate 102, and the like may be provided over the passivation film 160. When the opposing substrate is provided, a space between the base substrate 102 and the opposing substrate may be filled with an organic resin as a filler or filled with an inert gas.

As described above, the second layer 164 having a relatively large thickness is formed so as to absorb the inclination (projections and depressions) caused by the partition wall 142, and then the thickness of the second layer 164 is reduced, by which each of the first layer 162, the second layer 164, and the third layer 166 can possess a substantially uniform thickness. The emission region of the light-emitting element 136 is a region in which the first electrode 140 is in direct contact with the EL layer 144 and substantially corresponds to the opening portion 143 of the partition wall 142. Hence, the first layer 162, the second layer 164, and the third layer 166 each can have a uniform thickness in substantially the whole of the emission region of the light-emitting element 136. As a result, the optical distance of the passivation film 160 can be uniform in the emission region of each sub-pixel 106, and a uniform optical property can be obtained in each sub-pixel 106.

When the light-emission obtained in the light-emitting element 136 is extracted through the second electrode 152, unevenness of the optical property of the passivation film 160 in each sub-pixel 106 results in unevenness of the light-emission of the sub-pixels 106. On the other hand, the application of the aforementioned manufacturing method is able to provide a uniform optical property in each sub-pixel 106, suppress the unevenness of the light-emission of the sub-pixels 106, and supply an image with high display quality.

In contrast, when the manufacturing method of the present embodiment in which the thickness of the second layer 164 is reduced is not employed and the second layer 164 having a relatively small thickness is formed, the second layer 164 tends to have a non-uniform thickness in the emission region. Specifically, like the right sub-pixel 106_1 shown in FIG. 7A, the material used in the formation of the second layer 164 readily aggregates in a region close to a sidewall of the first layer 162 due to its surface tension and low affinity to the first layer 162. That is, the so-called coffee-cup phenomenon occurs. When the material is polymerized or cured in such a state, the second layer 164 is delocalized near the sidewall of the first layer 162, and the uniform thickness cannot be obtained in the emission region.

When the third layer 166 is further formed in this state, the third layer 166 covers the second layer 164 while the shape of the delocalized second layer 162 is maintained (FIG. 7B). As shown in FIG. 7B, portions a and b in which the thickness of the second layer 164 is large and small, respectively, are formed in the sub-pixel 106_1. Accordingly, the optical property becomes non-uniform in the sub-pixel 106_1, resulting in the unevenness of the emission and the decrease in quality of the reproduced image.

Furthermore, the manufacturing method of the present embodiment is effective in the case where a foreign object formed in the manufacture of the display device 100 is deposited in the sub-pixels 106. For example, in the case where a foreign object 170 is deposited over the first layer 162, the material used in the formation of the second layer 164 is also delocalized near the foreign object 170 due to the coffee-cup phenomenon as shown by the sub-pixel 106_2 of FIG. 7A. When the material is cured or polymerized, this shape is maintained, giving portions c and d in which the thickness of the second layer 164 is large and small, respectively, in the sub-pixel 106_1 as shown in FIG. 7B. As a result, the optical property becomes non-uniform in the sub-pixel 106_1, resulting in the unevenness of the emission and the decrease in quality of the reproduced image.

Figure 9:
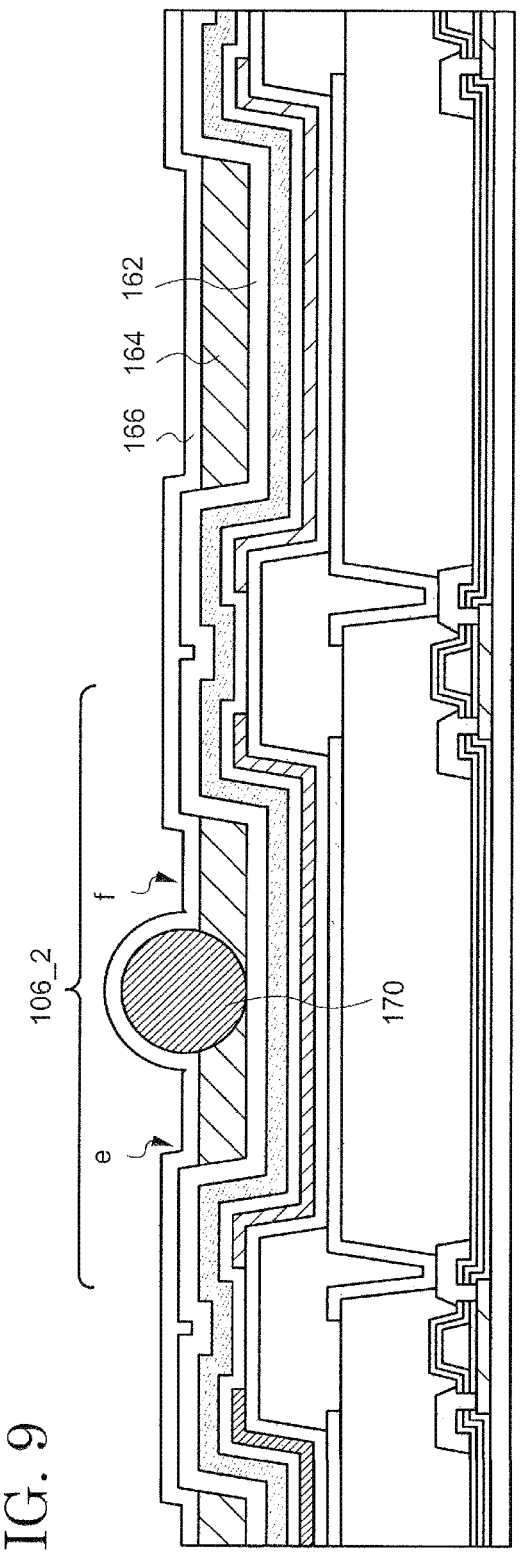
FIG. 9 is a schematic cross-sectional view showing a manufacturing method of a display device according to an embodiment.

In contrast, when the manufacturing method of the present embodiment is employed, the coffee-cup phenomenon does not occur in the formation of the second layer 164. Hence, it is possible to form the second layer 164 so that the whole of the foreign object 170 can be embedded and the second layer 164 has a flat top surface (FIG. 8A). Even if the thickness of the second layer 164 is sequentially reduced, the substantially uniform thickness can be maintained in the emission region (FIG. 8B). Therefore, as shown in FIG. 9, the same optical property can be obtained in both region e which is close to the edge portion of the sub-pixel 106_2 and region f between the edge portion and the foreign object 170, and the emission unevenness is not readily generated. Accordingly, even if the foreign object 170 is left over the sub-pixels 106, high image quality can be maintained.

Embodiment 2

In the present embodiment, a manufacturing method of a display device different from that of Embodiment 1 is explained with reference to FIG. 10A to FIG. 11. In the present embodiment, a method for manufacturing a display device 200 having flexibility is described. Description of the structures which are the same as those of Embodiment 1 may be omitted.

Figure 10A:
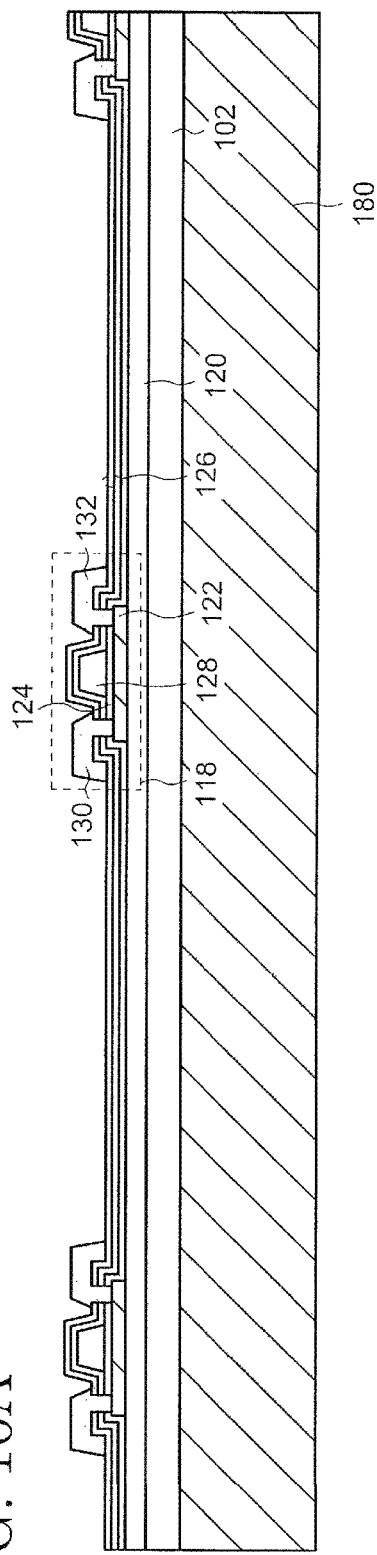
FIG. 10A and FIG. 10B are each a schematic cross-sectional view showing a manufacturing method of a display device according to an embodiment.

First, the base substrate 102 is formed over a substrate 180 (FIG. 10A). The substrate 180 has a function to support the base substrate and each element formed thereover, and a material which has physical strength to fulfill this function and which has heat tolerance and chemical stability to the process for the formation of each element. Specifically, glass, quartz, plastic, a metal, ceramics, and the like can be used. It is preferred to use a material which transmits light employed in the photo-irradiation process described below. The substrate 180 is also called a supporting substrate.

The base substrate 102 may include a material which is the same as that described in Embodiment 1 and can be formed by the aforementioned wet film-forming method. Note that the base substrate 102 is formed having a thickness which allows the base substrate 102 to independently have flexibility in order to manufacture a flexible display device.

Similar to Embodiment 1, the transistor 118, the leveling film 134, the light-emitting element 136, and the passivation film 160 are formed over the base substrate 102 (FIG. 10A). As an optional structure, a color filter, a light-shielding film, or a film or a substrate for sealing may be formed over the passivation film 160.

Sequentially, the substrate 102 is irradiated with light by utilizing a laser light source, a flash light, and the like by which adhesion between the base substrate 102 and the substrate 108 can be reduced. The light is preferably applied on a side of the substrate 180.

Figure 10B:
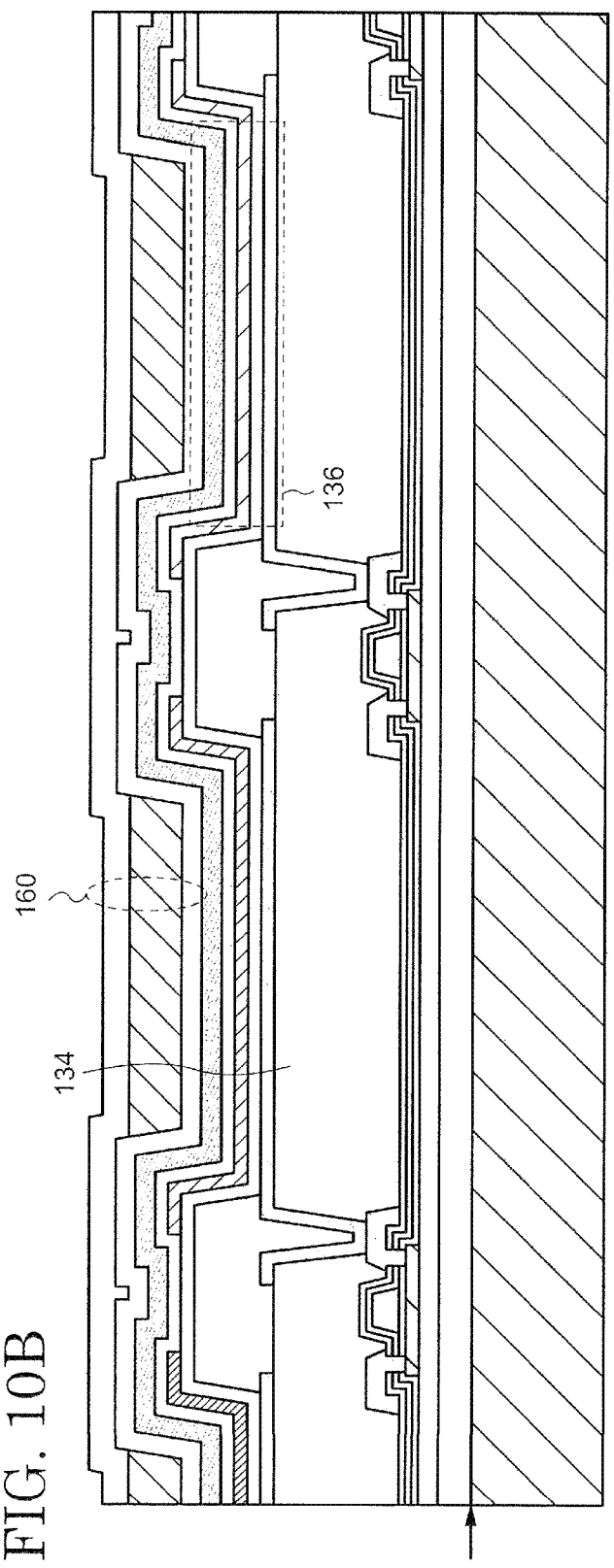
Figure 11:
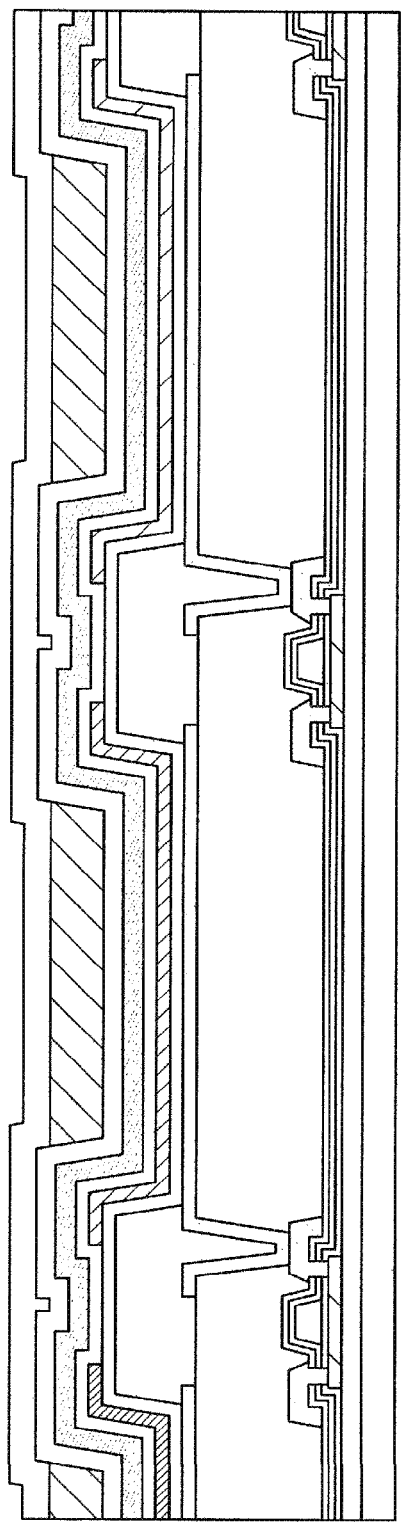
FIG. 11 is a schematic cross-sectional view showing a manufacturing method of a display device according to an embodiment.

After that, the substrate 180 is separated along the interface indicated by the arrow of FIG. 10B, namely the interface between the base substrate 102 and the substrate 180, thereby giving the display device 200 which is an embodiment of the present invention and shown in FIG. 11.

The display device 200 of the present embodiment also possesses the passivation film 160 shown in Embodiment 1. Hence, a uniform optical property can be obtained in each sub-pixel 106, an unevenness of emission of the sub-pixel 106 can be suppressed, and an image with high display quality can be provided.

The aforementioned modes described as the embodiments of the present invention can be implemented by being appropriately combined with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although cases of the organic EL display device are exemplified, the embodiments can be applied to any kind of display devices of a flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by the persons ordinarily skilled in the art.

What is claimed is:

1. A display device comprising:
    a first sub-pixel and a second sub-pixel adjacent to each other and each including a light-emitting element which comprises:
        a first electrode;
        a second electrode; and
        an EL layer sandwiched between the first electrode and the second electrode;
    an insulating film located between the first sub-pixel and the second sub-pixel and overlapping with the first electrodes of the first sub-pixel and the second sub-pixel;
    a first layer overlapping with the light-emitting elements of the first sub-pixel and the second sub-pixel and including an inorganic compound as a main component;
    a second layer over the first layer, the second layer including an organic compound as a main component; and
    a third layer over the second layer, the third layer including an inorganic compound as a main component,
    wherein the second layer is divided between the first sub-pixel and the second sub-pixel.

2. The display device according to claim 1,
    wherein the insulating film protrudes from the second layer.

3. The display device according to claim 1,
    wherein the first layer and the third layer continue from the first sub-pixel to the second sub-pixel.

4. The display device according to claim 3,
    wherein the thickness of the insulating film is equal to or larger than 15 μm and equal to or smaller than 50 μm, and
    wherein the thickness of the second layer is equal to or larger than 1 μm and equal to or smaller than 5 μm.

5. The display device according to claim 1,
    wherein the second layer has a flat top surface.

6. The display device according to claim 1,
    wherein the second layer has a thickness smaller than a thickness of the insulating film.

7. The display device according to claim 1,
the inorganic compound is selected from silicon nitride, silicon oxide, silicon nitride oxide, and silicon oxynitride.

8. The display device according to claim 1,
wherein the second layer includes a resin.

9. A display device comprising:
a light-emitting element comprising:
   a first electrode;
   an EL layer over the first electrode; and
   a second electrode over the EL layer;
an insulating film underneath the EL layer, the insulating film covering an edge portion of the first electrode and having an opening portion overlapping with the first electrode;
a first layer over the light-emitting element, the first layer including an inorganic compound as a main component;
a second layer over the first layer, the second layer including an organic compound as a main component; and
a third layer over the second layer, the third layer including an inorganic compound as a main component,
wherein the first layer and the third layer are in contact with each other in a region overlapping with the insulating film, and
wherein a top surface of the second layer is flat in a region overlapping with the opening portion.

10. The display device according to claim 9,
wherein a part of a top surface of the first layer is parallel to a top surface of the first electrode, and the whole of the part is in contact with a bottom surface of the second layer.

11. The display device according to claim 9,
wherein at least one of the first layer and the third layer includes silicon nitride.

12. The display device according to claim 9,
wherein the second layer includes a resin.

13. The display device according to claim 9, further comprising:
a base substrate under the first electrode,
wherein the base substrate includes a polymer.

14. The display device according to claim 13,
wherein the base substrate has flexibility.

* * * * *